United States Patent
Akiyama et al.

(10) Patent No.: US 9,606,012 B2
(45) Date of Patent: Mar. 28, 2017

(54) SEMICONDUCTOR DEVICE AND MANUFACTURING METHOD THEREOF

(71) Applicant: Renesas Electronics Corporation, Kawasaki-shi (JP)

(72) Inventors: Yutaka Akiyama, Kawasaki (JP); Yasutaka Nakashiba, Kawasaki (JP)

(73) Assignee: RENESAS ELECTRONICS CORPORATION, Kawasaki-Shi, Kanagawa (JP)

(*) Notice: Subject to any disclaimer, the term of this patent is extended or adjusted under 35 U.S.C. 154(b) by 0 days.

(21) Appl. No.: 14/244,820

(22) Filed: Apr. 3, 2014

(65) Prior Publication Data

US 2014/0312440 A1    Oct. 23, 2014

(30) Foreign Application Priority Data

Apr. 18, 2013  (JP) .................................. 2013-087796

(51) Int. Cl.
  *H01L 29/84*   (2006.01)
  *G01L 9/00*    (2006.01)
  *H01L 41/113*  (2006.01)

(52) U.S. Cl.
  CPC ............ *G01L 9/005* (2013.01); *G01L 9/0055* (2013.01); *H01L 29/84* (2013.01); *H01L 41/113* (2013.01)

(58) Field of Classification Search
  CPC ..... G01L 9/005; G01L 13/025; G01L 9/0055; G01L 9/0045; H01L 29/84; H01L 41/113
  See application file for complete search history.

(56) References Cited

U.S. PATENT DOCUMENTS

| | | | | |
|---|---|---|---|---|
| 3,899,695 A | * | 8/1975 | Solomon | G01L 1/2281 219/209 |
| 4,618,397 A | * | 10/1986 | Shimizu et al. | 438/53 |
| 4,977,101 A | * | 12/1990 | Yoder | B81C 1/00246 438/332 |
| 5,122,856 A | * | 6/1992 | Komiya | H01L 21/76898 257/622 |

(Continued)

FOREIGN PATENT DOCUMENTS

| | | |
|---|---|---|
| JP | H02-181472 A | 7/1990 |
| JP | 2008-190970 A | 8/2008 |

OTHER PUBLICATIONS

Japanese Office Action dated Dec. 6, 2016, with an English translation.

*Primary Examiner* — Michele Fan
(74) *Attorney, Agent, or Firm* — McGinn IP Law Group, PLLC

(57) ABSTRACT

An object of the present invention is to suppress an error in the value detected by a pressure sensor, which may be caused when environmental temperature varies. A semiconductor substrate has a first conductivity type. A semiconductor layer is formed over a first surface of the semiconductor substrate. Each of resistance parts has a second conductivity type, and is formed in the semiconductor layer. The resistance parts are spaced apart from each other. A separation region is a region of the first conductivity type formed in the semiconductor layer, and electrically separates the resistance parts from each other. A depressed portion is formed in a second surface of the semiconductor substrate, and overlaps the resistance parts, when viewed planarly. The semiconductor layer is an epitaxial layer.

19 Claims, 7 Drawing Sheets

(56) References Cited

U.S. PATENT DOCUMENTS

| | | | | |
|---|---|---|---|---|
| 5,350,939 A | * | 9/1994 | Honda et al. | 257/378 |
| 5,889,312 A | * | 3/1999 | Miura | H01L 27/0802 |
| | | | | 257/420 |
| 2006/0231841 A1 | * | 10/2006 | Okuno | H01L 21/823487 |
| | | | | 257/66 |
| 2009/0039387 A1 | * | 2/2009 | Okino et al. | 257/184 |
| 2009/0117724 A1 | * | 5/2009 | Iwamuro | H01L 21/31116 |
| | | | | 438/586 |
| 2010/0218826 A1 | * | 9/2010 | Hahn | H01L 31/068 |
| | | | | 136/261 |

* cited by examiner

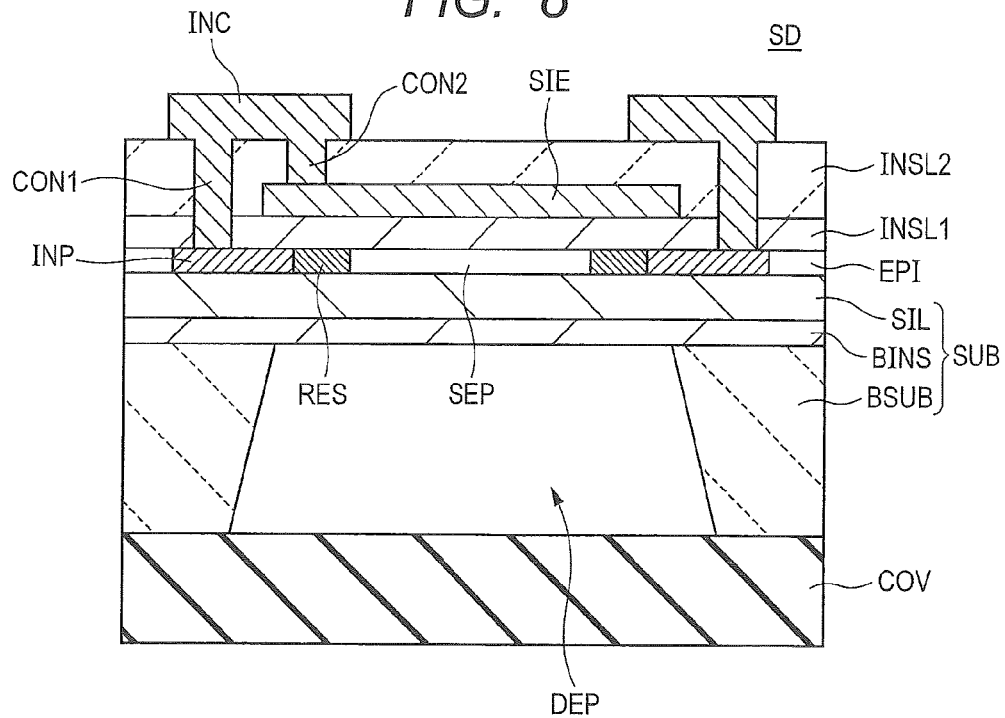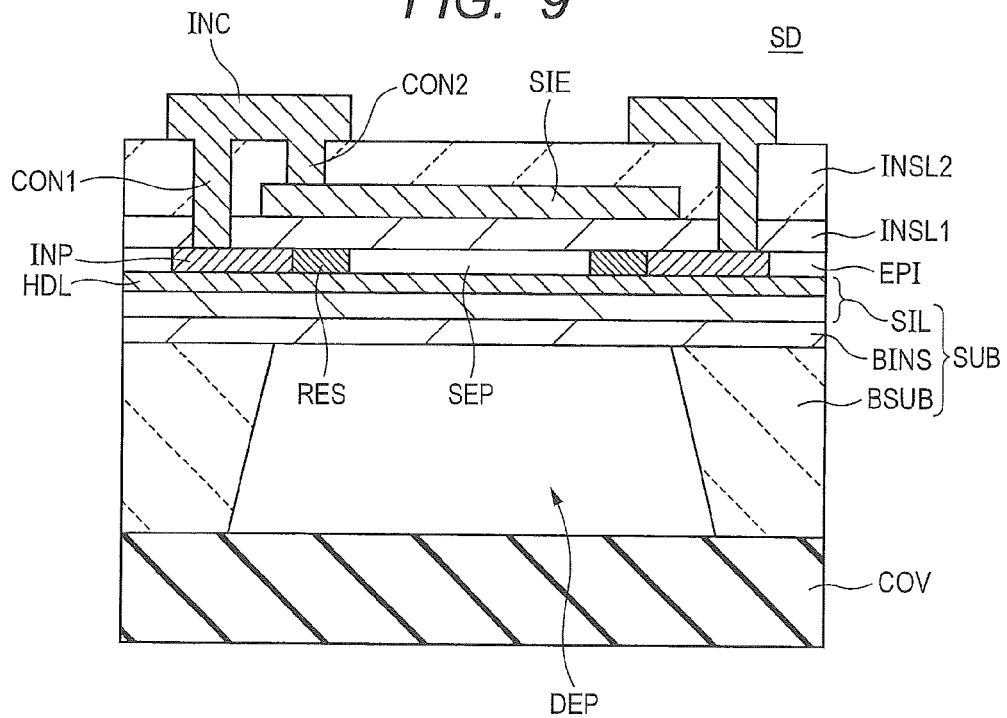

SEMICONDUCTOR DEVICE AND MANUFACTURING METHOD THEREOF

CROSS-REFERENCE TO RELATED APPLICATIONS

The disclosure of Japanese Patent Application No. 2013-087796 filed on Apr. 18, 2013 including the specification, drawings and abstract is incorporated herein by reference in its entirety.

BACKGROUND

The present invention relates to a semiconductor device and a manufacturing method thereof, and provides a technique that can be applied, for example, to a semiconductor device having a pressure sensor.

Examples of a pressure sensor detecting pressure include, for example, the semiconductor device described in Japanese Unexamined Patent Publication No. 2008-190970. This semiconductor device has a strain gauge over a first surface of a silicon substrate. This strain gauge is formed by diffusing impurities or implanting ions into the first surface of the silicon substrate. A depressed portion is formed in a second surface of the silicon substrate. A part of the silicon substrates, where the strain gauge is formed, is small in thickness, because this depressed portion is formed. In such a structure, when the external pressure varies, a strain is generated in the strain gauge, thereby allowing the resistance of the strain gauge to be changed. The aforementioned pressure sensor detects pressure based on a change in the resistance of the strain gauge.

SUMMARY

In recent years, semiconductor devices having a pressure sensor have been used in various environments. On the other hand, the change rate of the resistance of a conducting layer formed by introducing impurities into a semiconductor layer is temperature-dependent. When the change rate thereof is so temperature-dependent, a value detected by the pressure sensor is changed with the environmental temperature, thereby causing an error in the value. The present inventors have investigated to make the error small. Other problems and new characteristics will become clear from the description and accompanying drawings of the present specification.

According to an embodiment, a semiconductor layer is formed over a first surface of a semiconductor substrate. A plurality of resistance parts spaced apart from each other is provided in the semiconductor layer. A depressed portion is provided in a second surface of the semiconductor substrate. The depressed portion overlaps the resistance parts, when viewed planarly. The semiconductor layer is an epitaxial layer.

According to the embodiment, an error in the value detected by a pressure sensor, which may be caused when the environmental temperature varies, can be suppressed.

BRIEF DESCRIPTION OF THE DRAWINGS

FIG. 8 is a sectional view illustrating a configuration of a semiconductor device according to Second Embodiment; and FIG. 9 is a sectional view illustrating a configuration of a semiconductor device according to Third Embodiment.

DETAILED DESCRIPTION

Figure 1:
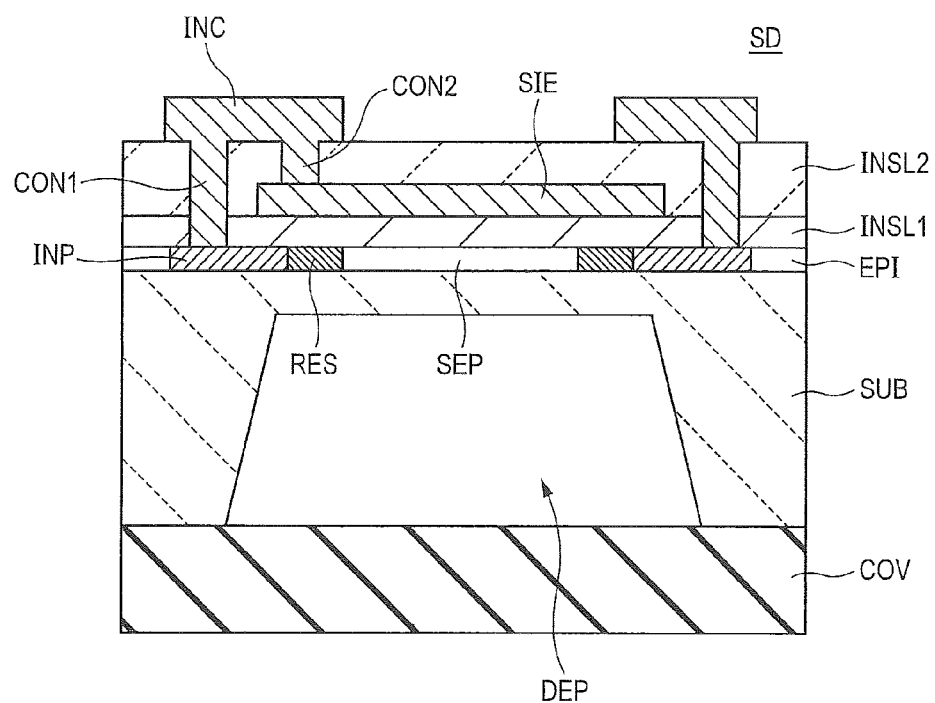
FIG. 1 is a sectional view illustrating a configuration of a semiconductor device according to First Embodiment.

Hereinafter, some embodiments will be described using the accompanying drawings. The same or like components illustrated in each drawing are denoted by like reference numerals, and the duplicative descriptions will be appropriately omitted.

First Embodiment

FIG. 1 is a sectional view illustrating a configuration of a semiconductor device SD according to First Embodiment. The semiconductor device SD according to the present embodiment includes a semiconductor substrate SUB, a semiconductor layer EPI, a plurality of resistance parts RES, a separation region SEP, and a depressed portion DEP. The semiconductor substrate SUB is a semiconductor substrate of a first conductivity type. The semiconductor layer EPI is formed over a first surface of the semiconductor substrate SUB. Each of the resistance parts RES has a second conductivity type, and is formed in the semiconductor layer EPI. The resistance parts RES are spaced apart from each other. The separation region SEP is a region of the first conductivity type formed in the semiconductor layer EPI, and electrically separates the resistance parts RES from each other. The depressed portion DEP is formed in a second surface of the semiconductor substrate SUB, and overlaps the resistance parts RES, when viewed planarly. The semiconductor layer ERI is an epitaxial layer. In a portion of each of the resistance parts RES located in the semiconductor layer EPI, a difference between a maximum and a minimum of the impurity concentration profile in the thickness direction of the portion is 20% or less of the minimum. Detailed description will be made hereinafter.

In the following description, the first conductivity type is set to be an n-type and the second conductivity type a p-type. However, the first conductivity type may be a p-type and the second conductivity type an n-type.

The semiconductor substrate SUB is, for example, an n-type single-crystal silicon substrate. However, the first surfaces of the semiconductor substrate SUB may be a sapphire layer or a polysilicon layer. When the semiconductor substrate SUB is a silicon substrate, the crystal orientation of the surface of the semiconductor substrate SUB is, for example, (100). The semiconductor layer EPI is formed over the first surface of the semiconductor substrate SUB. The thickness ($t_1$) of the semiconductor layer EPI is, for example, 0.05 $\mu m \leq t_1 \leq 0.2$ $\mu m$. However, the thickness thereof is not limited thereto. The depressed portion DEP is formed in the second surface of the semiconductor substrate SUB. The thickness of a portion of the semiconductor substrate SUB, where the depressed portion DEP is formed, is, for example, 5 to 15 μm.

The semiconductor layer EPI is a p-type epitaxial layer, such as, for example, a p-type silicon layer. Impurities are introduced into the semiconductor layer EPI, when the layer EPI is epitaxially grown over the first surface of the semiconductor substrate SUB. The separation region SEP is formed by introducing n-type impurities into the semiconductor layer EPI. Each of the resistance parts RES is a portion of the semiconductor layer EPI, into which n-type impurities are not introduced. The resistance parts RES are part of a pressure sensor.

Accordingly, the impurity concentration profile in the thickness direction of each of the resistance parts RES becomes almost constant, and as described above, a difference between a maximum and a minimum of the impurity concentration profile is 20% or less of the minimum. It is preferable that a p-type impurity concentration ($c_1$) of each of the resistance parts RES is $5 \times 10^{18}/cm^3 \leq c_1 \leq 5 \times 10^{19}/cm^3$.

The separation region SEP includes the same p-type impurities as those in the resistance parts RES. The p-type impurity concentration profile in the thickness direction of the separation region SEP is almost the same as that in the thickness direction of each of the resistance parts RES.

An interconnection part INP is formed in the semiconductor layer EPI. The interconnection part INP is a p-type impurity layer, and is formed by introducing p-type impurities into the semiconductor layer EPI. Accordingly, the p-type impurity concentration of the interconnection part INP is higher than that of each of the resistance parts RES. The impurity concentration ($c_2$) of the interconnection part INP is, for example, $5 \times 10^{19}/cm^3 \leq c_2 \leq 5 \times 10^{20}/cm^3$. The interconnection part INP is provided for each of the resistance parts RES to be linked to each of them. The interconnection part IMP is provided for coupling each of the resistance parts RES to the later-described first contact CON1.

A first insulating film INSL1 and a second insulating film INSL2 are formed in this order over the semiconductor layer EPI. The first insulating film INSL1 and the second insulating film INSL2 are, for example, silicon oxide films. Interconnection INC is formed over the second insulating film INSL2. The interconnection INC is coupled to the interconnection part INP via the first contact CON1 embedded in the first insulating film INSL1 and the second insulating film INSL2.

A shielding member SIE is formed over the first insulating film INSL1. The shielding member SIE is formed of a conductive material, such as, for example, polysilicon, and overlaps the resistance parts RES, when viewed planarly. The shielding member SIE is coupled to any one of the interconnection INC via a second contact CON2 embedded in the second insulating film INSL2. Thereby, a fixed potential, for example, a power supply potential is applied to the shielding member SIE. The shielding member SIE functions as a shield for suppressing a noise from reaching the resistance parts RES.

A sealing member COV is provided over the second surface of the semiconductor substrate SUB. The sealing member COV is, for example, a glass substrate, and seals the depressed portion DEP. Accordingly, when the pressure around the semiconductor device SD varies, a difference between the pressure in the depressed portion DEP and that around the device SD varies. The sealing member COV is hardly deformed by the variation in the pressure difference. Accordingly, a variation in the pressure difference is absorbed with a portion of the semiconductor substrate SUB, located over the bottom of the depressed portion DEP, being distorted. The distortion of this portion generates a change in the resistance of the resistance parts RES.

When the sealing member COV is a glass substrate, the member COV is anodically bonded to the second surface of the semiconductor substrate SUB.

The inside of the depressed portion DEP is in a vacuum state. By putting the inside thereof in a vacuum state, a value detected by a pressure sensor in the semiconductor device SD indicates an absolute value of pressure. When the pressure sensor in the semiconductor device SD has only to indicate a differential pressure, however, the sealing member COV may not be provided.

Figure 2:
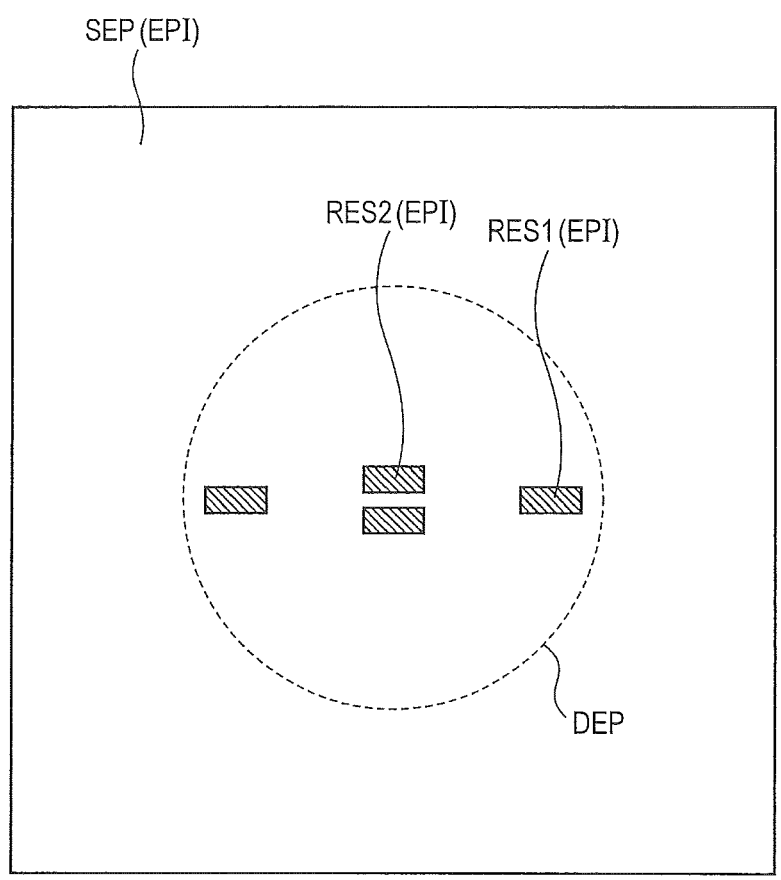
FIG. 2 is a view illustrating an example of a planar layout of a plurality of resistance parts.

FIG. 2 is a view illustrating an example of the planar layout of the resistance parts RES. In the example illustrated in FIG. 2, the bottom of the depressed portion DEP has a circular shape. Four resistance parts RES are provided in the semiconductor layer EPI. When viewed planarly, two of the four resistance parts RES, resistance parts RES1, are located near to the edge of the bottom of the depressed portion DEP, while remaining two of the four, resistance parts RES2, are located near to the center of the bottom thereof. The two resistance parts RES1 are arranged to be symmetrical with respect to the center of the bottom of the depressed portion DEP, and the two resistance parts RES2 are also arranged in the same way. The straight line connecting the two resistance parts RES1 together and that connecting the two resistance parts RES2 together intersect at right angles.

Figure 3:
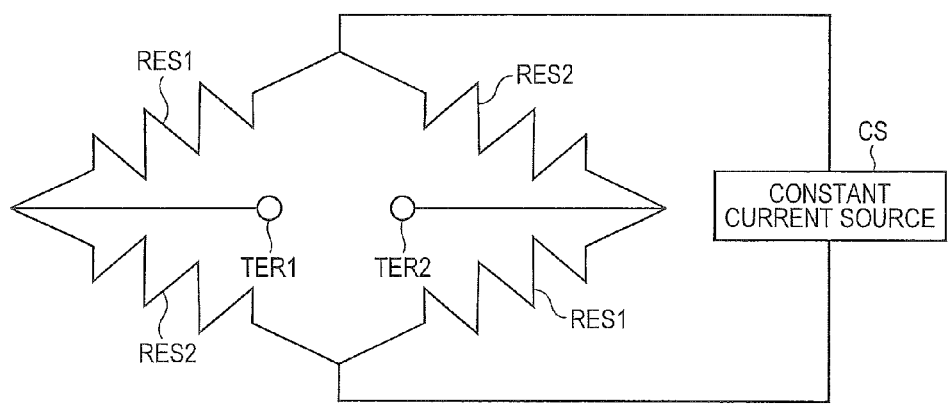
FIG. 3 is a view illustrating an equivalent circuit of a pressure sensor having the resistance parts.

FIG. 3 is a view illustrating an equivalent circuit of a pressure sensor having the resistance parts RES. The two resistance parts RES1 and the two resistance parts RES2 are coupled in series in the order of the first resistance part RES1, the first resistance part RES2, the second resistance part RES1, and the second resistance part RES2. The back end of the second resistance part RES2 is coupled to the front end of the first resistance part RES1. That is, the two resistance parts RES1 and the two resistance parts RES2 form a loop circuit.

A constant current source CS is coupled across the coupling portion, between the first resistance part RES1 and the first resistance part RES, and the coupling portion, between the second resistance part RES1 and the second resistance part RES2. An output terminal TER2 is coupled to the coupling portion between the first resistance part RES2 and the second resistance part RES1, and an output terminal TER1 is coupled to the coupling portion between the second resistance part RES2 and the first resistance part RES1. The pressure sensor included in the semiconductor device SD outputs a change in the potential difference between the output terminals TER1 and TER2 as a signal indicating pressure.

FIGS. 4A to 6 are sectional views illustrating an example of a method of manufacturing the semiconductor device SD illustrated in FIGS. 1 to 3. The method of manufacturing the semiconductor device SD, illustrated in these Figs., includes the following steps. First, the semiconductor layer EPI is formed over the first surface of the semiconductor substrate SUB. The semiconductor layer ERI is a p-type epitaxial layer. Subsequently, the separation region SEP is formed by introducing n-type impurities into the semiconductor layer EPI. Each of the resistance parts RES is a region of the semiconductor layer EPI, into which n-type impurities are not introduced. Detailed description will be made hereinafter.

Figure 4A:
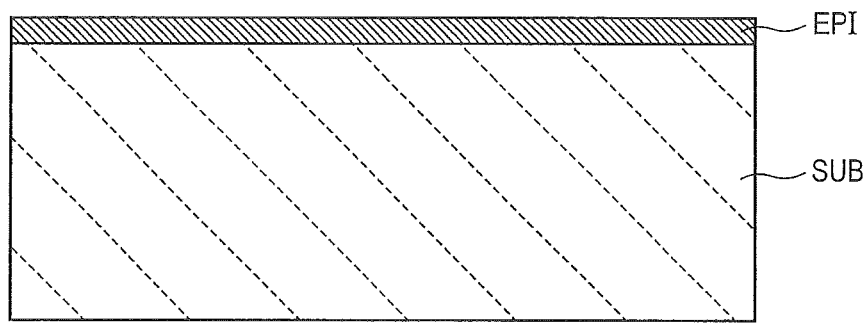
FIGS. 4A and 4B are sectional views illustrating an example of a method of manufacturing the semiconductor device.

First, the n-type semiconductor substrate SUB is provided, as illustrated in FIG. 4A. Subsequently, the semiconductor layer EPI is epitaxially grown over the first surface of the semiconductor substrate SUB. At the time, an impurity gas is introduced into a material gas. Thereby, p-type impurities are introduced into the semiconductor layer EPI when formed. And, the p-type impurity concentration in the depth direction of the semiconductor layer EPI becomes almost constant. As described above, it is preferable that the impurity concentration ($c_1$) is $5\times10^{18}/cm^3 \leq c_1 \leq 5\times10^{19}/cm^3$.

Figure 4B:
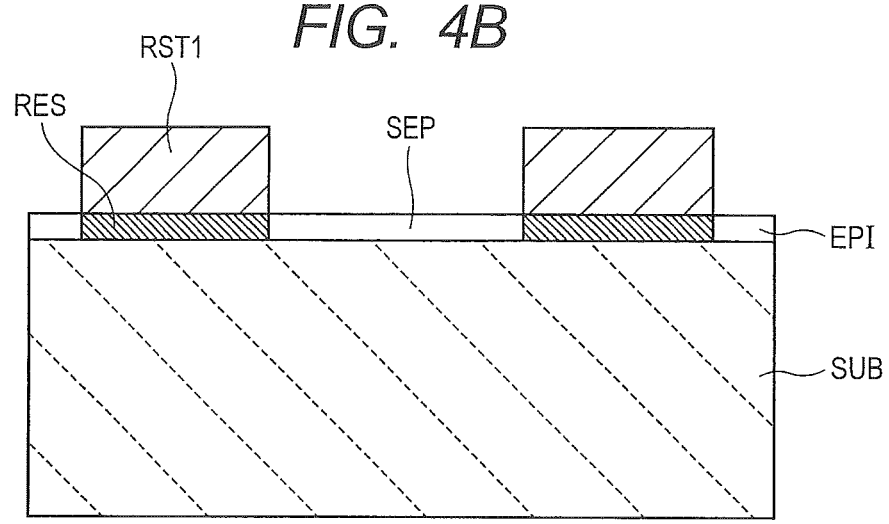

Subsequently, a resist pattern RST1 is formed over the semiconductor layer EPI, as illustrated in FIG. 4B. The resist pattern RST1 covers, of the semiconductor layer EPI, regions that will become the resistance parts RES and the interconnection part INP. Subsequently, n-type impurities are ion implanted into the semiconductor layer EPI by using the resist pattern RST1 as a mask. Thereby, the separation region SEP is formed in the semiconductor layer EPI. At least part of a region of the semiconductor layer EPI, into which n-type impurities are not introduced, will become the resistance parts RES. Alternatively, the resist pattern RST1 may cover only the region of the semiconductor layer EPI, which will become the resistance parts RES.

Figure 5A:
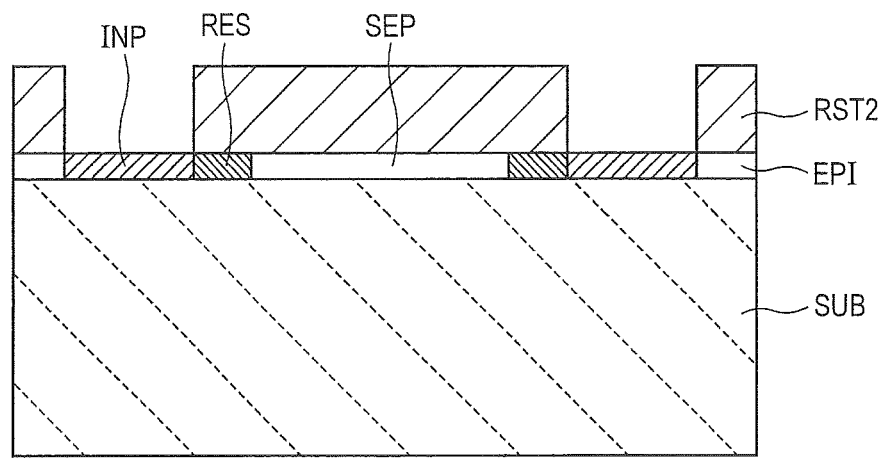
FIGS. 5A and 5B are sectional views illustrating an example of a method of manufacturing the semiconductor device.

Subsequently, the resist pattern RST1 is removed, as illustrated in FIG. 5A. Subsequently, a resist pattern RST2 is formed over the semiconductor layer EPI. The resist pattern RST2 covers, of the semiconductor layer EPI, regions that will become the resistance parts RES and the separation region SEP, but does not cover a region that will become the interconnection part INP. Subsequently, p-type impurities are ion implanted into the semiconductor layer EPI by using the resist pattern RST2 as a mask. Thereby, the interconnection part INP is formed in the semiconductor layer EPI.

Figure 5B:
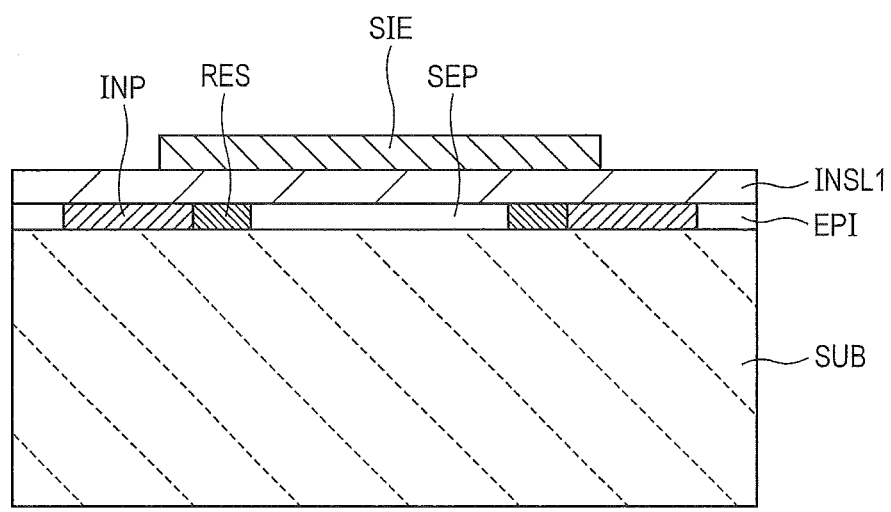

Subsequently, the resist pattern RST2 is removed, as illustrated in FIG. 5B. Subsequently, the first insulating film INSL1 is formed over the semiconductor layer EPI by using, for example, a CVD method. Subsequently, a conducting film, such as, for example, a polysilicon film, is formed over the first insulating film INSL1. Impurities may be introduced into the polysilicon film when formed. The conducting film may be formed by using a CVD method or a sputtering method. Subsequently, a resist pattern (not illustrated) is formed over the conducting film to selectively remove the conducting film by using the resist pattern as a mask. Thereby, the shielding member SIE is formed over the first insulating film INSL1. Subsequently, the resist pattern is removed.

Figure 6:
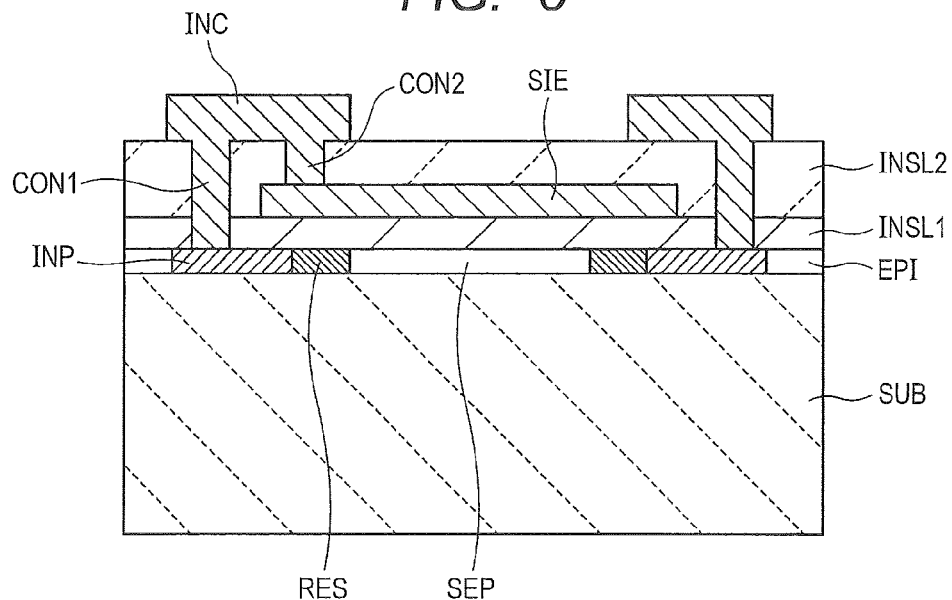
FIG. 6 is a sectional view illustrating an example of a method of manufacturing the semiconductor device.

Subsequently, the second insulating film INSL2 is formed over the shielding member SIE and the first insulating film INSL1, as illustrated in FIG. 6, by using, for example, a CVD method. Subsequently, a resist pattern (not illustrated) is formed over the second insulating film INSL2 such that the second insulating film INSL2 and the first insulating film INSL1 are etched by using the resist pattern as a mask. Thereby, coupling holes in which the first contact CON1 and the second contact CON2 are embedded are formed. Subsequently, the resist pattern is removed.

Subsequently, a conducting film, such as, for example, an Al film, is formed in the coupling holes and over the second insulating film INSL2. Subsequently, a resist pattern (not illustrated) is formed over the conducting film such that the conducting film is etched by using the resist pattern as a mask. Thereby, the first contact CON1, the second contact CON2, and the interconnection INC are formed. Alternatively, the first contact CON1 and the second contact CON2 may be formed in a step different from that for the interconnection INC. In this case, the first contact CON1 and the second contact CON2 may be formed of a material different from that of the interconnection INC. Alternatively, the interconnection INC and the second insulating film INSL2 may be covered with a protective insulating film.

Subsequently, a mask pattern (not illustrated) is formed over the second surface of the semiconductor substrate SUB such that the semiconductor substrate SUB is etched from the second surface side by using the mask pattern as a mask. Thereby, the depressed portion DEP is formed in the semiconductor substrate SUB. The etching performed at the time may be dry etching or wet etching. Subsequently, the sealing member COV is attached to the second surface of the semiconductor substrate SUB, if necessary.

Hereinafter, advantages of the present embodiment will be described. The temperature dependence of a change in the resistance of the semiconductor layer EPI varies with the impurity concentration of the semiconductor layer EPI, and has a minimum. Accordingly, by setting the impurity concentration of each of the resistance parts RES to be the minimum or close thereto, an error in the value detected by the pressure sensor, which may be caused when temperature varies, can be suppressed.

When the resistance parts RES are formed by an ion implantation method, the impurity concentration of each of the resistance parts RES varies in the depth direction. In this case, the resistance of at least part in the thickness direction of each of the resistance parts RES greatly varies with temperature. Accordingly, it is difficult to suppress an error in the value detected by a pressure sensor.

On the other hand, the semiconductor layer EPI is formed by a p-type epitaxial layer in the present embodiment. And, a portion of the semiconductor layer EPI, into which n-type impurities are not introduced, is used as the resistance parts RES. Accordingly, the impurity concentration of each of the resistance parts RES hardly varies in the depth direction. Accordingly, an error in the value detected by the pressure sensor can be suppressed.

Figure 7:
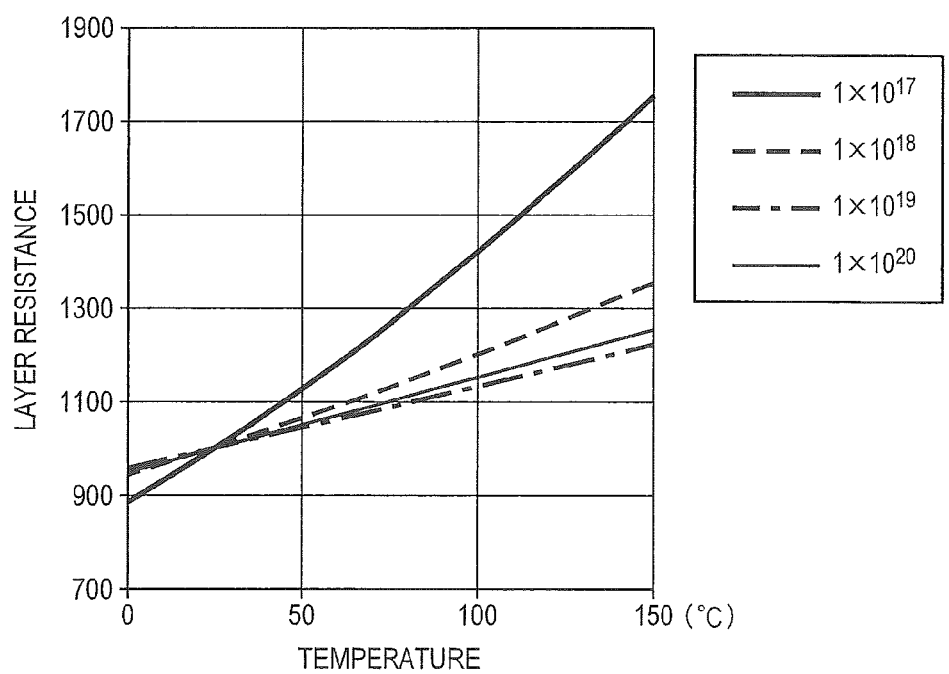
FIG. 7 is a graph showing temperature dependence of the resistances of the resistance parts.

FIG. 7 is a graph showing the temperature dependence of the resistances of the resistance parts RES, when the semiconductor layer EPI is formed of a silicon layer. When the impurity concentration of each of the resistance parts RES is $1\times10^{17}$ $cm^3$, the resistance of the resistance parts RES greatly varies with temperature, as shown in this view. On the other hand, the temperature dependence of the resistance of the resistance parts RES becomes small as the impurity concentration approaches $1\times10^{19}$ $cm^3$. This temperature dependence becomes a minimum when the impurity concentration of each of the resistance parts RES is $1\times10^{19}$ $cm^3$. This temperature dependence becomes larger little by little as the impurity concentration becomes larger than $1\times10^{19}$ $cm^3$.

From these results, by setting the p-type impurity concentration ($c_1$) of each of the resistance parts RES (i.e., the p-type impurity concentration of the semiconductor layer EPI) to be $5\times10^{19}/cm^3 \leq C_1 \leq 5\times10^{19}/cm^3$, an error in the value detected by the pressure sensor can be suppressed.

Second Embodiment

FIG. 8 is a sectional view illustrating a configuration of a semiconductor device SD according to Second Embodiment, and corresponds to FIG. 1 in First Embodiment. The semiconductor device SD according to the present embodiment has the same configuration as that of the semiconductor device SD of First Embodiment, except for the following points.

First, a semiconductor substrate SUB is an SOI substrate, and has a configuration in which an embedded insulating layer BINS and an n-type silicon layer SIL are laminated in this order over a base substrate BSUB made of silicon. A semiconductor layer EPI is formed over the silicon layer SIL, and a depressed portion DEP is formed in the base substrate BSUB. The embedded insulating layer BINS functions as an etching stopper in the etching for forming the depressed portion DEP. Accordingly, the embedded insulating layer BINS is exposed to the bottom of the depressed portion DEP.

Also, according to the present embodiment, the same advantages as those in First Embodiment can be obtained. Further, a variation in the depth of the depressed portion DEP can be suppressed, because the embedded insulating layer BINS is used as an etching stopper when the depressed portion DEP is formed.

Third Embodiment

FIG. 9 is a sectional view illustrating a configuration of a semiconductor device SD according to Third Embodiment, and corresponds to FIG. 8 in Second Embodiment. The semiconductor device SD according to the present embodiment has the same configuration as that of the semiconductor device SD of Second Embodiment, except that the semiconductor device SD of the present embodiment includes an n-type highly-concentrated first impurity layer HDL.

The highly-concentrated first impurity layer HDL is located over a top layer of a first surface of the semiconductor substrate SUB. The n-type impurity concentration of the highly-concentrated first impurity layer HDL is higher than that of the semiconductor substrate SUB (the silicon layer SIL in the present embodiment). The highly-concentrated first impurity layer HDL is formed by ion implanting n-type impurities into the first surface of the semiconductor substrate SUB. The ion implantation step is performed before a semiconductor layer EPI is formed.

Also, according to the present embodiment, the same advantages as those in Second Embodiment can be obtained. Further, extension in the depth direction of each of a plurality of resistance parts RES can be suppressed even if p-type impurities are diffused from each of the resistance parts RES to the semiconductor substrate SUB, because the highly-concentrated first impurity layer HDL is formed over the top layer of the first surface of the semiconductor substrate SUB. If one of the resistance parts RES extends in the depth direction, the impurity concentration at the bottom thereof is decreased, thereby causing the resistance of a lower portion of the resistance parts RES to be greatly changed with temperature.

Alternatively, the highly-concentrated first impurity layer HDL described in the present embodiment may be provided in the semiconductor device SD of First Embodiment.

The invention made by the present inventors has been described above based on preferred embodiments, but the invention should not be limited to the embodiments, and it is needless to say that various modifications may be made to the invention within a range not departing from the gist of the invention.

What is claimed is:

1. A semiconductor device comprising:
   a semiconductor substrate of a first conductivity type;
   a semiconductor layer formed over a first surface of the semiconductor substrate;
   resistance parts of a second conductivity type, which are formed in the semiconductor layer and spaced apart from each other;
   a separation region of the first conductivity type, which is formed in the semiconductor layer and separates the resistance parts from each other; and
   a depressed portion which is formed in a second surface of the semiconductor substrate and which overlaps the separation region and the resistance parts, when viewed planarly,
   wherein the semiconductor layer and the resistance parts comprise an epitaxial layer, and
   wherein the resistance parts comprise:
      a first pair of resistance parts formed near an edge of a bottom of the depressed portion, and symmetrically arranged with respect to a center of the bottom of the depressed portion in a first direction; and
      a second pair of resistance parts formed near the center of the bottom of the depressed portion, and symmetrically arranged with respect to the center of the bottom of the depressed portion in a second direction perpendicular to the first direction.

2. The semiconductor device according to claim 1, wherein the separation region includes impurities of the same second conductivity type as that of the resistance parts, and a concentration profile of the impurities of the second conductivity type in the thickness direction of the separation region is almost the same as that in the thickness direction of each of the resistance parts.

3. The semiconductor device according to claim 1, wherein a concentration ($c_1$) of the impurities of the second conductivity type of each of the resistance parts is $5 \times 10^{18}/cm^3 \leq c_1 \leq 5 \times 10^{19}/cm^3$.

4. The semiconductor device according to claim 1, wherein a thickness ($t_1$) of the semiconductor layer is $0.05\ \mu m \leq t_1 \leq 0.2\ \mu m$.

5. The semiconductor device according to claim 1, comprising:
   a highly-concentrated layer of the first conductivity type, which is located over a top layer of the first surface of the semiconductor substrate and has a concentration higher than that of the semiconductor substrate,
   wherein the semiconductor layer is located over the highly-concentrated layer of the first conductivity type.

6. The semiconductor device according to claim 1, wherein the epitaxial layer has the second conductivity type, and the resistance parts and the separation region are formed by forming the separation region with impurities of the first conductivity type being introduced into the semiconductor layer.

7. The semiconductor device according to claim 1, wherein an impurity concentration of the resistance parts in a thickness direction is substantially constant.

8. The semiconductor device according to claim 1, wherein a difference between a maximum and a minimum of an impurity concentration profile of the resistance parts in a thickness direction is 20% or less of the minimum.

9. The semiconductor device according to claim 1, wherein a thickness of the semiconductor substrate at the depressed portion is in a range from 5 μm to 15 μm.

10. The semiconductor device according to claim 1, further comprising:
    an insulating film formed on the semiconductor layer; and
    an interconnection formed on the insulating film.

11. The semiconductor device according to claim 10, further comprising:
    an interconnection part of the second conductivity type formed in the semiconductor layer, an impurity concentration of the interconnection part being greater than an impurity concentration of the resistance parts.

12. The semiconductor device according to claim 10, wherein the insulating film comprises a first insulating film formed on a surface of the semiconductor layer, and a second insulating film formed on the first insulating film.

13. The semiconductor device according to claim 12, further comprising:
a shielding member formed on the first insulating film and comprising a conductive material, the shielding member overlapping the resistance parts in a plan view.

14. The semiconductor device according to claim 13, further comprising:
a second contact formed in the second insulating film and coupling the shielding member to the interconnection.

15. The semiconductor device according to claim 1, wherein the bottom of the depressed portion comprises a circular shape in a plan view, and the resistance parts are formed inside the bottom of the depressed portion in a plan view.

16. The semiconductor device according to claim 1, wherein the resistance parts comprise a rectangular shape in a plan view, and the resistance parts are arranged longitudinally in the first direction.

17. A semiconductor device comprising:
a semiconductor substrate of a first conductivity type;
a semiconductor layer formed over a first surface of the semiconductor substrate;
resistance parts of a second conductivity type, which are formed in the semiconductor layer and spaced apart from each other;
a separation region of the first conductivity type, which is formed in the semiconductor layer and separates the resistance parts from each other; and
a depressed portion which is formed in a second surface of the semiconductor substrate and which overlaps the separation region and the resistance parts, when viewed planarly,
wherein, in a portion of each of the resistance parts located in the semiconductor layer, a difference between a maximum and a minimum of an impurity concentration profile in the thickness direction of the portion is 20% or less of the minimum, and
wherein the resistance parts comprise a resistance part formed near an edge of a bottom of the depressed portion, and a resistance part formed near a center of the bottom of the depressed portion.

18. The semiconductor device according to claim 17, wherein the semiconductor layer comprises an epitaxial layer.

19. A semiconductor device comprising:
a semiconductor substrate of a first conductivity type;
a semiconductor layer formed over a first surface of the semiconductor substrate;
resistance parts of a second conductivity type, which are formed in the semiconductor layer and spaced apart from each other;
a separation region of the first conductivity type, which is formed in the semiconductor layer and separates the resistance parts from each other; and
a depressed portion which is formed in a second surface of the semiconductor substrate and which overlaps the separation region and the resistance parts, when viewed planarly,
wherein the semiconductor layer and the resistance parts comprise an epitaxial layer,
wherein the resistance parts comprise a resistance part formed near an edge of a bottom of the depressed portion, and a resistance part formed near a center of the bottom of the depressed portion, and
wherein the semiconductor device further comprises:
an insulating film formed on the semiconductor layer;
an interconnection formed on the insulating film;
an interconnection part of the second conductivity type formed in the semiconductor layer, an impurity concentration of the interconnection part being greater than an impurity concentration of the resistance parts; and
a first contact projecting from the interconnection part toward the semiconductor substrate and contacting the interconnection part such that the interconnection part couples a resistance part of the resistance parts to the first contact.

* * * * *